United States Patent
Aoki et al.

(10) Patent No.: US 10,090,586 B2
(45) Date of Patent: Oct. 2, 2018

(54) WIRELESS COMMUNICATION DEVICE WITH JOINED SEMICONDUCTORS

(71) Applicant: International Business Machines Corporation, Armonk, NY (US)

(72) Inventors: Toyohiro Aoki, Yokohama (JP); Noam Kaminski, Kiryat Tivon (IL); Keishi Okamoto, Kawasaki (JP); Kazushige Toriyama, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/645,553

(22) Filed: Jul. 10, 2017

(65) Prior Publication Data

US 2017/0309998 A1    Oct. 26, 2017

Related U.S. Application Data

(63) Continuation of application No. 14/735,199, filed on Jun. 10, 2015, now Pat. No. 9,780,442.

(30) Foreign Application Priority Data

Jun. 30, 2014    (JP) ................. 2014-134831

(51) Int. Cl.
   *H01Q 1/50*    (2006.01)
   *H01Q 1/38*    (2006.01)
   (Continued)

(52) U.S. Cl.
   CPC .............. *H01Q 1/38* (2013.01); *H01L 23/66* (2013.01); *H01L 24/17* (2013.01); *H01L 24/81* (2013.01);
   (Continued)

(58) Field of Classification Search
   CPC ..................................... H32B 7/14; H01Q 1/38
   (Continued)

(56) References Cited

U.S. PATENT DOCUMENTS

| 5,313,096 A | 5/1994 | Eide |
| 5,621,554 A | 4/1997 | Kuniyori |

(Continued)

FOREIGN PATENT DOCUMENTS

| JP | 6236981 A | 8/1994 |
| JP | 08162574 A | 6/1996 |

(Continued)

OTHER PUBLICATIONS

IBM: List of IBM Patents or Patent Applications Treated as Related (Appendix P), Jul. 11, 2017 pp. 1-2.

(Continued)

*Primary Examiner* — Peguy Jean Pierre
(74) *Attorney, Agent, or Firm* — Michael O'Keefe

(57) ABSTRACT

A joined structure which is configured such that a space between adjacent substrates is filled with a filling material. The joined structure includes a first substrate having a first conductor formed on a surface of the first substrate, a second substrate having a second conductor formed on a surface of the second substrate, arranged so that a surface of the first substrate faces a surface of the second substrate, a connecting conductor which electrically connects the first conductor and the second conductor, and a filling material between the first substrate and the second substrate. The filling material is formed into such a shape that a space is provided which corresponds to at least one of the first conductor, the second and the connecting conductor.

18 Claims, 10 Drawing Sheets

(51) Int. Cl.
  *H01Q 1/22* (2006.01)
  *H01L 23/00* (2006.01)
  *H01L 23/66* (2006.01)
  *H01L 21/56* (2006.01)

(52) U.S. Cl.
  CPC ......... *H01Q 1/2283* (2013.01); *H01L 21/563* (2013.01); *H01L 2223/6677* (2013.01); *H01L 2224/16227* (2013.01); *H01L 2924/1421* (2013.01); *H01L 2924/1422* (2013.01); *H01L 2924/1426* (2013.01); *H01L 2924/14215* (2013.01); *H01L 2924/20271* (2013.01)

(58) Field of Classification Search
  USPC .................................. 156/291, 292; 343/908
  See application file for complete search history.

(56) References Cited

U.S. PATENT DOCUMENTS

| | | |
|---|---|---|
| 6,181,278 B1 | 1/2001 | Kakimoto et al. |
| 9,380,688 B1 | 6/2016 | Feng et al. |
| 2002/0129894 A1 | 9/2002 | Liu et al. |
| 2005/0151215 A1 | 7/2005 | Hauhe et al. |
| 2006/0055021 A1 | 3/2006 | Yamamoto |
| 2011/0140801 A1 | 6/2011 | Shimura et al. |
| 2014/0124947 A1 | 5/2014 | Chuang et al. |
| 2015/0332997 A1 | 11/2015 | Nakamura et al. |
| 2015/0380813 A1 | 12/2015 | Aoki et al. |

FOREIGN PATENT DOCUMENTS

| | | |
|---|---|---|
| JP | 09213840 A | 8/1997 |
| JP | H09237803 A | 9/1997 |
| JP | 10064932 A | 3/1998 |
| JP | 10125825 A | 5/1998 |
| JP | 2002289643 A | 10/2002 |
| JP | 2004342823 A | 12/2004 |
| JP | 2006344672 A | 12/2006 |
| JP | 2007005477 A | 1/2007 |
| JP | 2013122718 A | 6/2013 |
| JP | 2016012704 A | 1/2016 |
| WO | 2012102303 A1 | 8/2012 |

OTHER PUBLICATIONS

Pfeiffer et al., "A 60GHz Radio Chipset Fully-Integrated in a Low-Cost Packaging Technology", 2006 Electronic Components and Technology Conference, IEEE, pp. 1343-1346.

WIRELESS COMMUNICATION DEVICE WITH JOINED SEMICONDUCTORS

BACKGROUND

The present invention generally relates to a semiconductor packaging technology, and more particularly to a joined structure in which a space between adjacent substrates is configured to be filled with a filling material, a joining method for the joined structure, a substrate structure for the joined structure, a wireless module based on the joined structure, and a wireless communication device including the joined structure.

SUMMARY

In recent years, a millimeter waveband has received attention as a next-generation wireless frequency band, and the development of a semiconductor package for the millimeter waveband has been desired, which has a low cost and a high performance. Until now, the semiconductor package for the millimeter waveband has been proposed, in which an antenna is provided on a substrate, and a semiconductor chip and an antenna are connected to and integrated with each other by a flip-chip interconnection technique. Such a structure where the antenna is separated from the semiconductor chip and is packaged is said to have a high cost performance, as compared with the case where the antenna is provided on the semiconductor chip.

FIG. 10 is a view schematically illustrating a semiconductor package structure 500 of a conventional technology as has been described above. As is illustrated in FIG. 10, in a flip-chip mounting technique, a gap between a substrate 510 and a semiconductor chip 520 is filled with a filling material which is referred to as an underfill 540, so as to protect a joining area 530 which connects the substrate 510 and the semiconductor chip 520. The underfill 540 has a function of dispersing stress due to a mismatch among coefficients of thermal expansion of materials existing between the substrate 510 and the semiconductor chip 520, and the underfill 540 is important for a reliable connection between the substrates.

However, when the frequency increases up to a range of a millimeter waveband, an influence cannot be neglected which the underfill 540 gives on the transmission of a radio-frequency signal. The present inventors made an extensive investigation, and as a result, it became clear that there is such a bad influence that a transmission loss in a radio-frequency band increases particularly in an antenna 512 on a surface of the substrate 510, a wire 522 on the surface of the semiconductor chip 520, and the joining area 530 between the substrates, which are covered with the underfill 540.

Until now, the influence which the underfill 540 gives on the semiconductor circuit has been described, for instance, in JP09-213840A (Patent Literature 1). Patent Literature 1 describes that when a particular semiconductor chip having an field effect transistor (FET) is mounted in which a void is formed under a gate electrode, an epoxy resin is left in the void, and a capacitance between a gate and a source and a capacitance between a gate and a drain of the FET increases.

In the conventional technology of the above described Patent Literature 1, when the above described particular semiconductor chip is mounted, a gate capacitance can be reduced. An influence of the filling material is not considered. The influence of the filling material on a wire which transmits a radio-frequency signal through a joining area and an antenna, is not considered when the radio-frequency signal has increased to a range of the millimeter waveband.

Accordingly, in the joined structure by the flip-chip mounting technique, the development of a new semiconductor package structure is needed which ensures a reliable connection, and which can simultaneously reduce transmission losses in a radio-frequency band in a signal transmission path, which originates in a filling material such as an underfill.

The present invention is designed with respect to the insufficient points in the above described conventional technology, and an objective of the present invention is to provide a joined structure which keeps a reliable connection between substrates in a connected structure, and simultaneously can reduce transmission losses in a signal transmission path.

Another object of the present invention is to provide a joining method and a substrate structure which keep a reliable connection between the substrates, and simultaneously reduce the transmission loss in the signal transmission path. Further another object of the present invention is to provide a wireless module and a wireless communication device which have high connection reliability between the substrates, and also have the transmission loss reduced in the signal transmission path.

In order to solve the above described problems, the present invention provides a joined structure having the following characteristics. An embodiment of the present joined structure includes a first substrate having a first conductor formed on a surface of the first substrate, a second substrate having a second conductor formed on a surface of the second substrate and arranged so that the a surface of the first substrate faces a surface of the second substrate, a connecting conductor for electrically connecting the first conductor and the second conductor, and a filling material between the first substrate and the second substrate. In the present joined structure, the filling material is formed into such a shape that a space is provided so as to correspond to at least one of the first conductor, the second conductor and the connecting conductor.

In addition, an embodiment of the present invention provides a joining method having the following characteristics. The present joining method includes the steps of: preparing a first substrate and a second substrate each having a conductor formed on a surface of the substrate, forming a filling material for being filled between the first substrate and the second substrate, electrically connecting the conductor of the first substrate and the conductor of the second substrate to each other with a connecting conductor so that the surfaces face each other, and bonding the first substrate and the second substrate to each other with the filling material. In the step of forming the filling material, the structure of the filling material is formed so that a space is provided so as to correspond to at least one of the conductor of the first substrate, the conductor of the second substrate and the connecting conductor.

Furthermore, an embodiment of the present invention can provide a substrate structure having the following characteristics for being electrically connected to the target substrate having a conductor formed on a surface of the substrate. The present substrate structure includes a substrate having the conductor formed on a surface of the substrate, and a structure of the filling material formed on the surface of the substrate and to be filled in a space between the substrate and a target substrate after the substrates have been joined. The structure of the filling material is formed so that a space is provided so as to correspond to at least one of the conductor of the substrate, the conductor of the target substrate, and the connecting conductor for electrically connecting the substrate and the target substrate to each other.

Furthermore, an embodiment of the present invention provides a wireless module having the following characteristics. The present wireless module includes a first substrate having an antenna radiating electromagnetic waves based on a radio-frequency signal or converting electromagnetic waves into a radio-frequency signal, a second substrate having a transmission path therein transmitting the radio-frequency signal there through, a connecting conductor for electrically connecting the first substrate and the second substrate to each other, and a filling material filled between the first substrate and the second substrate. The filling material is formed so that a space is provided so as to correspond to at least the connecting conductor. In addition, the present invention can provide a wireless communication device including the joined structure.

According to an above described embodiment, the connected structure can keep the connection reliability between the substrates, and simultaneously can reduce the transmission loss in the signal transmission path.

DETAILED DESCRIPTION

An embodiment according to the present invention will be described below with reference to the attached drawings. The present invention is not limited to the embodiments illustrated in the attached drawings. Incidentally, note that the attached drawings are not reduced or expanded according to a scale ratio.

The joined structure according to an embodiment of the present invention is a joined structure in which substrates are connected so that the surfaces face each other, wherein a filling material to be filled in a gap between the substrates is formed so that a predetermined space is provided so as to correspond to at least one of a predetermined conductor formed on a surface of each of the substrates and a predetermined connecting conductor which electrically connects the substrates to each other. Thereby, the joined structure is designed to ensure connection reliability between the substrates, and simultaneously reduce transmission losses of a signal in a radio-frequency band, which originates in the existence of the filling material in the vicinity of a signal transmission path.

The joined structure according to the embodiment of the present invention will be described below while taking a semiconductor package 100 as an example, which is configured so that a semiconductor chip which has an integrated radio-frequency circuit of a millimeter waveband formed thereon is joined by a flip-chip mounting technique onto a substrate having an antenna for the millimeter waveband formed thereon.

Figure 1:
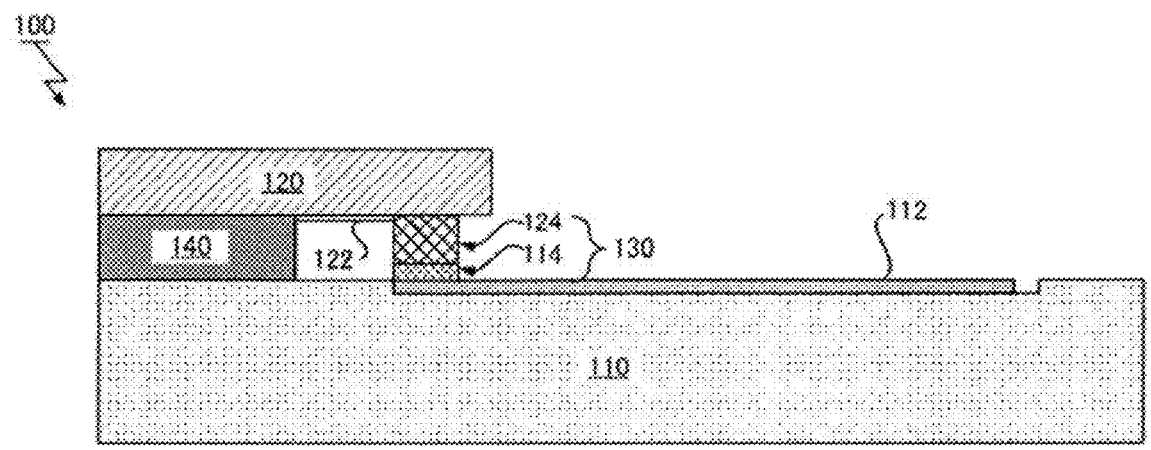
FIG. 1 is a sectional view schematically illustrating a structure of a semiconductor package according to an embodiment of the present invention.

FIG. 1 is a sectional view schematically illustrating a structure of the semiconductor package 100 according to an embodiment of the present invention. As is illustrated in FIG. 1, the semiconductor package 100 includes a substrate 110 having an antenna 112 for the millimeter waveband formed on the surface, and a semiconductor chip 120 which has the integrated radio-frequency circuit for the millimeter waveband formed thereon, and has a wire 122 formed on the surface, which transmits a radio-frequency signal for the millimeter waveband there through.

The substrate 110 is not limited in particular, but a substrate corresponding to radio frequency is used from the viewpoint of being correspondent to the millimeter wave. Such a substrate 110 can include: an organic substrate formed of an organic material, such as a fluororesin resin substrate of polytetrafluoroethylene (PTFE) or the like, a polyphenylene ether (PE) substrate, a bismaleimide triazine (BT) resin substrate and a liquid crystal polymer substrate; and an inorganic substrate such as a melted silica substrate and an alumina substrate.

The semiconductor chip 120 is not limited in particular, but semiconductor chips are typically used which use a substrate formed from a semiconductor material having high carrier mobility, such as a silicon-germanium (SiGe) base, a gallium arsenide (GaAs) base, an indium phosphide (InP) base and a gallium nitride (GaN) base, from the viewpoint of being correspondent to the millimeter wave.

The signal of the millimeter waveband, which is transmitted in a conductor such as the antenna 112 and the wire 122, is a radio-frequency (Radio Frequency: RF) signal in a frequency band having a frequency of 30 to 300 GHz. The millimeter waveband is not limited in particular, but can include typically a 60 GHz band, an E-band (70 to 90 GHz band, for instance, 70 GHz band, 80 GHz band and 90 GHz band), and a 120 GHz band.

On the surfaces of the substrate 110 and the semiconductor chip 120, the antenna 112, the wire 122 and another wire are formed, and furthermore, electrode portions 114 and 124 such as a pad, a ball, a pillar and a bump which are connected to the wire are formed. There is a case where a part or all of the antenna and the wire which are formed on the surfaces are covered, except the electrode portions, with a thin protective coat or a resist. The semiconductor chip 120 is mounted on the substrate 110 so that the surface on which the electrode portion 124 is formed faces a surface on which the electrode portion 114 of the substrate 110 is formed. Both of the electrode portions 114 and 124 are melted and joined to each other by a reflow or thermocompression bonding method, and thereby a joining area 130 is formed. The joining area 130 constitutes a connecting conductor which electrically connects the circuit in the side of the semiconductor chip 120 and the circuit in the side of the substrate 110 to each other.

A space between the substrate 110 and the semiconductor chip 120 is filled with an underfill 140 which is the filling material (which is also referred to as sealing material as well), and the substrate 110 and the semiconductor chip 120 are bonded to each other. The underfill 140 has a function of dispersing a stress due to a mismatch of coefficients of thermal expansion of the materials in the substrate 110 and the semiconductor chip 120. The underfill 140 may also enhance the reliability of the connection in the joining area 130 joined by the flip-chip connection technique. The space provided in the filling material may be provided such that a space surrounding the connecting conductor is formed.

The underfill 140 is not limited in particular, but can include an epoxy-based resin and a polyimide-based resin. The underfill 140 in the present embodiment is used as an NCF (Non Conductive Film) or an NCP (Non Conductive Paste) which is previously supplied onto the substrate 110 or the semiconductor chip 120 as a filling material, and connects the substrate 110 and the semiconductor chip 120 to each other. The underfill 140 may appropriately contain a fill material which matches the coefficient of thermal expansion of the substrate 110 and the semiconductor chip 120. Incidentally, the thickness of the underfill 140 may be appropriately designed according to the pitch of the electrode portions and the material characteristics.

Though the details will be described later, in a preferred embodiment, a photosensitive resin material can be used as the underfill 140. A photosensitive resin composition such as a positive type photoresist or a negative type photoresist may be used as the photosensitive resin material. In this case, the photosensitive resin composition is applied onto the substrate 110 or the semiconductor chip 120 before the joining process, then the coated layer is exposed to light and developed, and thereby a patterning structure of the filling material is formed which has a predetermined space provided therein. The substrate structure that is the semiconductor chip 120 or the substrate 110 which has the patterning structure of the filling material formed thereon is joined to the target substrate that is the other party (when filling material is formed on the semiconductor chip 120, the target substrate is the substrate 110, and when filling material is formed on the substrate 110, the target substrate is the semiconductor chip 120), by the flip-chip connection technique, and the developed patterning structure is cured simultaneously with the joining process or after the joining process. Thereby, the semiconductor package 100 can be formed in which the substrate 110 and the semiconductor chip 120 are connected and bonded to each other, as illustrated in FIG. 1.

Alternatively, in another embodiment, an NCF having a film shape can be used as the underfill 140. In this case, a film that has been patterned into a shape in which a predetermined space is provided (which includes case of being divided into plurality of parts) is affixed on the substrate 110 or the semiconductor chip 120, before the joining process, and a structure of the patterned filling material is formed which has a predetermined space provided therein. The substrate 110 or the semiconductor chip 120 having the structure of the patterned filling material formed therein is joined to the target substrate by the flip-chip connection technique, and the structure of the affixed film is cured simultaneously with the joining process or after the joining process. Thereby, the semiconductor package 100 as illustrated in FIG. 1 can be formed. In another embodiment, a solid film may be affixed onto or the solid coat is film-formed on the substrate 110 or the semiconductor chip 120, and then the solid film or the material of the coat may be removed by laser beam machining or the like so that a predetermined space is formed therein, in place of affixing the film which has been patterned into the shape that the predetermined space is provided therein. Thereby, the structure of the patterned filling material may be formed.

In an embodiment of the present invention, the underfill 140 is formed into such a shape that a space is provided so as to correspond to at least one of the antenna 112 for transmitting or receiving electromagnetic waves having the millimeter waveband on the above substrate 110, the wire 122 which is formed on the surface of the semiconductor chip 120 and in which the radio-frequency signal is transmitted, and the joining area 130 for connecting the antenna 112 and the wire 122 to each other.

In a preferred embodiment, the space which is provided in the underfill 140 is provided so as to surround the above joining area 130 to generate the space, as illustrated in FIG. 1. In another preferred embodiment, spaces are provided so as to be formed on a region on which a wire (for instance, wire 122) and an antenna (for instance, antenna 112) are formed that are conductors in which a radio-frequency signal of 20 GHz or more is transmitted, on the semiconductor chip 120 and the substrate 110. On the other hand, the filling material is filled in the gap between the substrate 110 and the semiconductor chip 120 such that the gap is filled with the filling material on the region in which the signal of 20 GHz or more is not transmitted, for instance, the region in which the wire is not formed and the region in which the wire is formed in which only a signal of less than 20 GHz is transmitted, from the viewpoint of keeping the connection reliable.

A relative permittivity $\in_{UF}$ of the filling material (which includes resin material and fill material as needed) may typically have a range of 3.5 to 4.0. On the other hand, the space provided in the underfill 140 gives a relative permittivity (<3.5) lower than that of the filling material; and preferably is filled with the air and gives a permittivity of the air (which is equal to that of vacuum, while relative permittivity $\in_{air}$ of the air=1.0006≈1).

In addition, the space provided in the underfill 140 is different from a space such as a void which is provided unintentionally in the underfill; and is designed to correspond to the circuit patterns of the substrate 110 and the semiconductor chip 120, and is intentionally introduced. For the purpose of forming a signal path from the semiconductor chip 120 to an external antenna 112 (hereinafter "antenna"), the space provided in the underfill 140 is typically formed so as to communicate with the outside of the structure which is formed of the substrate 110, the semiconductor chip 120, the joining area 130 and the underfill 140.

Furthermore, the space provided in the underfill 140 is not limited in particular, but may be configured to have a line width twice as wide as a line width of a predetermined wire, or wider. In an embodiment, the space provided in the underfill 140 has the line width at least 2.5 times wider than the line width of the predetermined wire in which the radio-frequency signal is transmitted, and can be formed so as to include an empty space which matches, or aligns with, approximately the middle of the wire. This is based on a simulation result that it is possible to sufficiently suppress the reduction in the transmission loss by forming the empty space having at least 2.5 times wider line width so as to match the wire. The above described structure is preferably adopted from the viewpoint of effectively reducing the transfer loss of the signal in the radio-frequency band, simultaneously acquiring a bonding area as wide as possible, and enhancing the connection reliability. The simulation result will be described later in detail.

The embodiment described above may result in the joined structure enabled to cope with both the ensuring of the connection reliability and the reduction in the transmission loss in the radio-frequency band in the transmission path in which the signal of 20 GHz or more is transmitted, which is easily affected by the filling material of the underfill 140.

Incidentally, in an embodiment illustrated in FIG. 1, the joined structure is configured as the semiconductor package 100; the rear face of the substrate 110 has another wiring pattern, a flat-face electrode pad and an array such as a ball formed thereon, though the detailed description is omitted; and the connected structure is configured as a BGA (Ball Grid Array) or LGA (Land Grid Array) package. However, the joined structure is not limited in particular, but may be mounted directly on a printed circuit board on which another circuit is formed or another semiconductor chip is mounted, and may be formed into a package structure by being sealed by the filling material.

In addition, in an embodiment illustrated in FIG. 1, a structure has been described as one example, in which the substrate 110 and the semiconductor chip 120 are joined to each other by the flip-chip connection technique. However, the joined structure is not limited to this joining technique, and may be any joining technique in which substrates are connected to each other. Here, the substrate includes a semiconductor chip, a semiconductor wafer and a package such as a wafer level package, in addition to a substrate on which a semiconductor chip is mounted, such as an interposer substrate and a main substrate. In addition, the semiconductor chip includes a wafer-level chip size package (WL-CSP) including a rewiring layer, and a stacked chip connected by a silicon through via, in addition to a bare chip which is an individual piece divided from a wafer; and may be a member having any form capable of being mounted on a substrate.

The joining technique may be applied, for instance, to semiconductor chips in a CoC (Chip on Chip) structure in which a daughter chip is mounted on a mother chip, and to a structure in which a space between the substrates are filled with a filling material in a structure in which a daughter board substrate that mounts the semiconductor chip thereon is mounted on a mother board substrate.

In addition, the semiconductor package 100 illustrated in FIG. 1 is configured by joining a semiconductor chip having an integrated radio-frequency circuit of a millimeter waveband formed therein, onto a substrate having the antenna for the millimeter waveband formed thereon, which is separated from the semiconductor chip. Such a structure that the antenna is separated from the semiconductor chip is said to have a high cost performance, as compared with the case where the antenna is provided on the semiconductor chip. However, when such a structure is adopted, the influence of the filling material in the joined structure between the semiconductor chip and the separated substrate including the antenna consequently becomes obvious. When the above described structure is adopted in which the space of the fill material is provided according to an embodiment of the present invention, as a countermeasure against the influence, a wireless module and a wireless communication device having high cost performance can be provided.

In addition, in a described embodiment, the configuration is used as a substrate including the antenna, in which the antenna 112 is formed on the surface of the substrate 110, but the configuration of the antenna is not limited in particular. The antenna may be formed on the rear face of the substrate 110, or the antenna is occasionally mounted in another substrate which is mounted on the substrate 110. In these cases, a wire which is finally connected to the antenna and transmits radio frequency there through results in being formed on the surface of the substrate 110, which faces the semiconductor chip 120.

Figure 2:
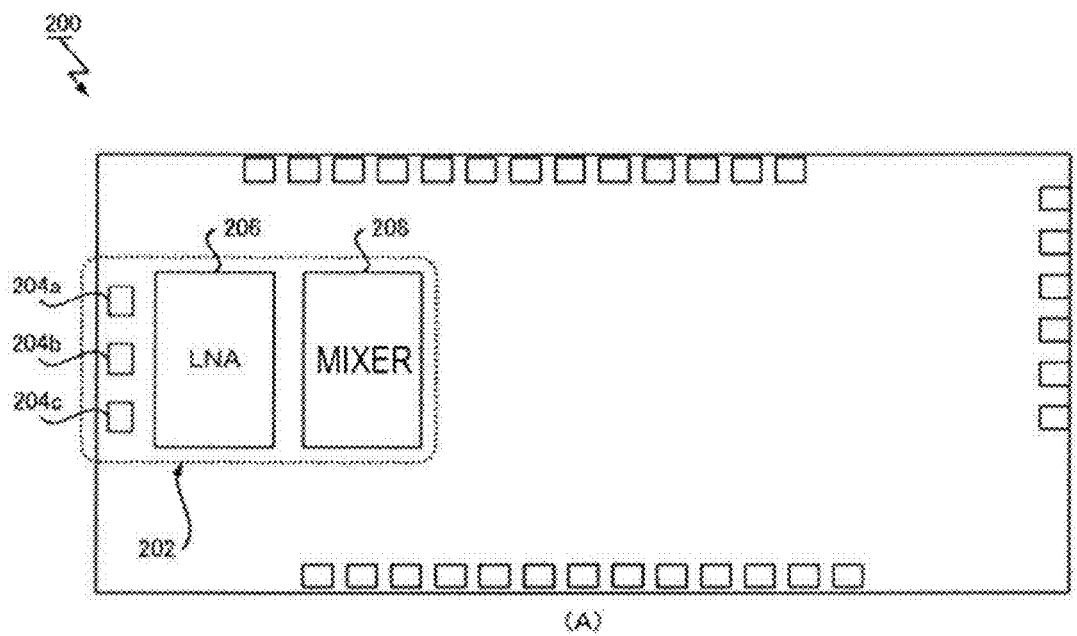
FIG. 2 is a view illustrating a circuit pattern of a receiving chip in (A) and an underfill pattern thereof in (B)
Figure 2:
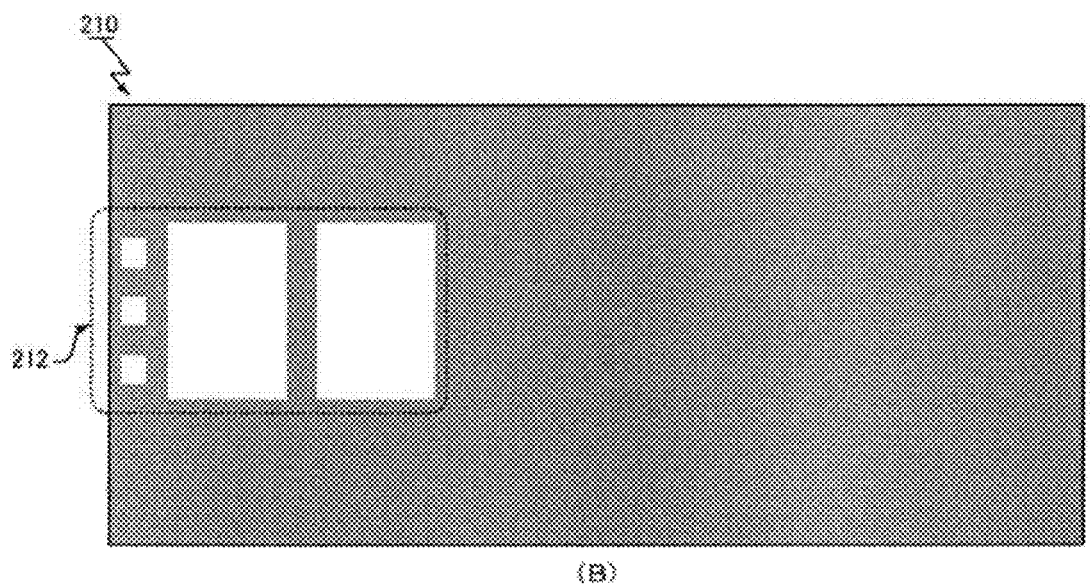
Figure 3:
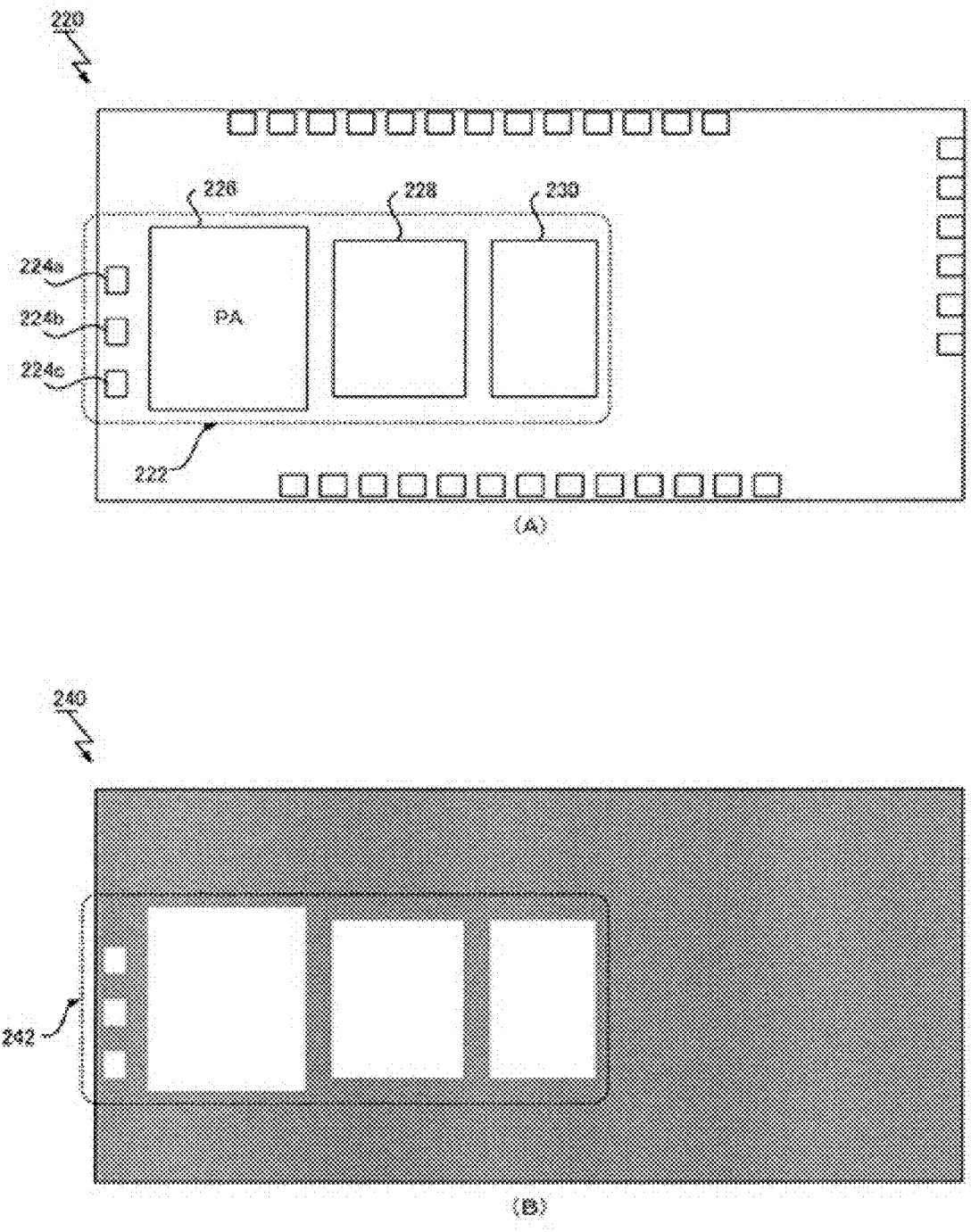
FIG. 3 is a view illustrating a circuit pattern of a sending chip in (A) and an underfill pattern thereof in (B)

An illustrative portion at which the space can be provided in the underfill will be described below with reference to FIG. 2 and FIG. 3. FIG. 2 and FIG. 3 each illustrate circuit patterns of semiconductor chips for the millimeter waveband in Figure (A) of the illustration, and underfill patterns corresponding to the circuit patterns in Figure (B) of the illustration. FIG. 2 illustrates a circuit pattern and an underfill pattern of a receiving chip 200 (hereinafter "Rx"), and FIG. 3 illustrates a circuit pattern and an underfill pattern of a sending chip 220 (hereinafter "Tx"). Incidentally, the circuit patterns and the underfill patterns illustrated in FIG. 2 and FIG. 3 schematically illustrate circuit layouts and the corresponding underfill patterns, but may include fine wiring and a corresponding empty space. In addition, the patterns illustrated in FIG. 2 and FIG. 3 are illustrations, and there exist various circuit designs of the receiving chip 200 and the sending chip 220. When the circuit designs are different, the underfill pattern is also changed so as to match the circuit design.

A receiving chip 200 illustrated in FIG. 2(A) may include circuit blocks such as a low noise amplifier (Low Noise Amplifier, LNA) 206, a down-converting mixer 208 (hereinafter "mixer"), a variable amplifier (Intermediate Frequency Variable Gain Amplifier, IFVGA) of an intermediate frequency band, a multiplier and a phase synchronization circuit (Phase-Locked Loop, PLL). On the left end of the layout illustrated in FIG. 2(A), input pads 204*a*, 204*b* and 204*c* are formed which may be used for a ground connected to the external antenna 112, a signal and a ground, respectively.

The LNA 206 may increase a signal noise ratio, and may amplify a weak signal. The down-converting mixer 208 may reduce a frequency of a receiving signal of the millimeter waveband into a frequency of a signal of an intermediate frequency band. The IFVGA may variably amplify the signal of the intermediate frequency. The PLL may generate the signal of a predetermined frequency, and the multiplier may multiply a signal sent from the PLL.

In an embodiment, a receiving signal of the millimeter waveband, which is input by the antenna, is input into the LNA 206, and the signal of the intermediate frequency band is output from the down-converting mixer 208. Accordingly, the radio-frequency signal is transmitted in a section from the input pad 204 to the position at which the down-converting mixer 208 has converted the frequency, through the LNA 206, and there is a possibility that the underfill strongly exerts an effect on the wire of a portion 202 including the input pad 204, the LNA 206 and the mixer 208. Then, in the underfill pattern 210 illustrated in FIG. 2(B), the underfill is patterned so that the space is provided in the portion 212 corresponding to the wire of these circuit elements. Incidentally, in FIG. 2(B), in the underfill pattern 210, a region in which the space is formed is expressed by a white solid.

The sending chip 220 illustrated in FIG. 3(A) may include circuit blocks such as a power amplifier (Power Amplifier, PA) 226, a pre-driver (Pre-driver) 228, an up-converting mixer 230, a variable amplifier (Intermediate Frequency Variable Gain Amplifier, IFVGA) of the intermediate frequency band, a multiplier and a phase synchronization circuit (Phase-Locked Loop, PLL). On the left end of the layout illustrated in FIG. 3(A), output pads 224*a*, 224*b* and 224*c* are formed which may be used for a ground connected to the external antenna 112, a signal and a ground, respectively.

The PA 226 may amplifies a radio-frequency signal to a desired output. The pre-driver 228 may amplify the input signal. The up-converting mixer 230 may raise the frequency of a sending signal of the intermediate frequency band to the radio-frequency band of the millimeter waves. The IFVGA may variably amplify a signal of the intermediate frequency band. The PLL may generate the signal of a predetermined frequency, and the multiplier may multiply the signal sent from the PLL.

The sending signal of the intermediate frequency band may be input into the up-converting mixer 230, and the sending signal of the millimeter waveband may be output from the PA 226 to the antenna. Accordingly, the signal of the millimeter waveband may be transmitted in a section from the position at which the up-converting mixer 230 has converted the frequency to the output pad 224 through the pre-driver 228 and the PA 226, and there is a possibility that the underfill 140 strongly exerts an effect on the wire of a portion 222 of the output pad 224, the PA 226, the pre-driver 228 and the mixer 230. In the underfill pattern 240 illustrated in FIG. 3(B), the underfill is patterned so that the space is provided in the portion 242 corresponding to a wire of these circuit elements. Incidentally, in FIG. 3(B) similarly to FIG. 2(B), a region in which the space is formed is expressed by a white solid in the underfill pattern 240.

As is illustrated in FIG. 2 and FIG. 3, in an embodiment, the joined structure has a configuration in the semiconductor chip 120 in which the space of the filling material is provided so as to correspond to the wire 122 on the surface of the semiconductor chip 120 associated with at least one of the LNA 206, the mixers 208 and 230, the pre-driver 228 and the PA 226 in which the radio-frequency (RF) signal is transmitted; and can provide a wireless module and a wireless communication device which has high connection reliability and has reduced transmission loss in the radio-frequency band.

In FIG. 2 and FIG. 3, the semiconductor chip 120 is described as configured such that the receiving chip 200 and the sending chip 220 are separate components. In an alternate embodiment the semiconductor chip 120 illustrated in FIG. 1 may be a single communication chip in which a sending circuit and a receiving circuit are integrally configured, and may be a system on chip (System on a Chip) configured by integrating one or both of the sending circuit and the receiving circuit with a logic circuit.

Figure 4:
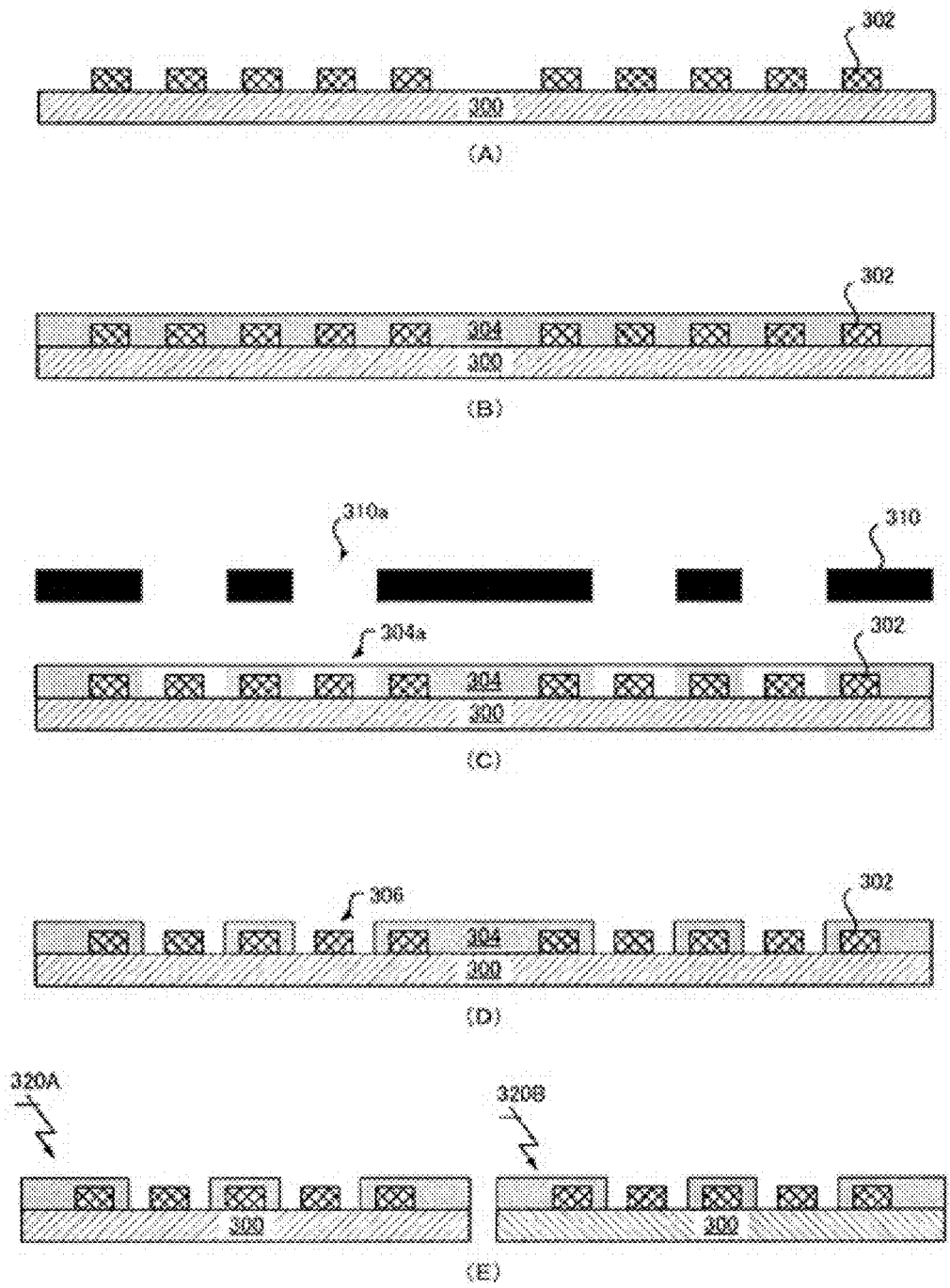
FIG. 4 is a view illustrating a joining method which uses a photosensitive resin material, according to a preferred embodiment (1/2)
Figure 5:
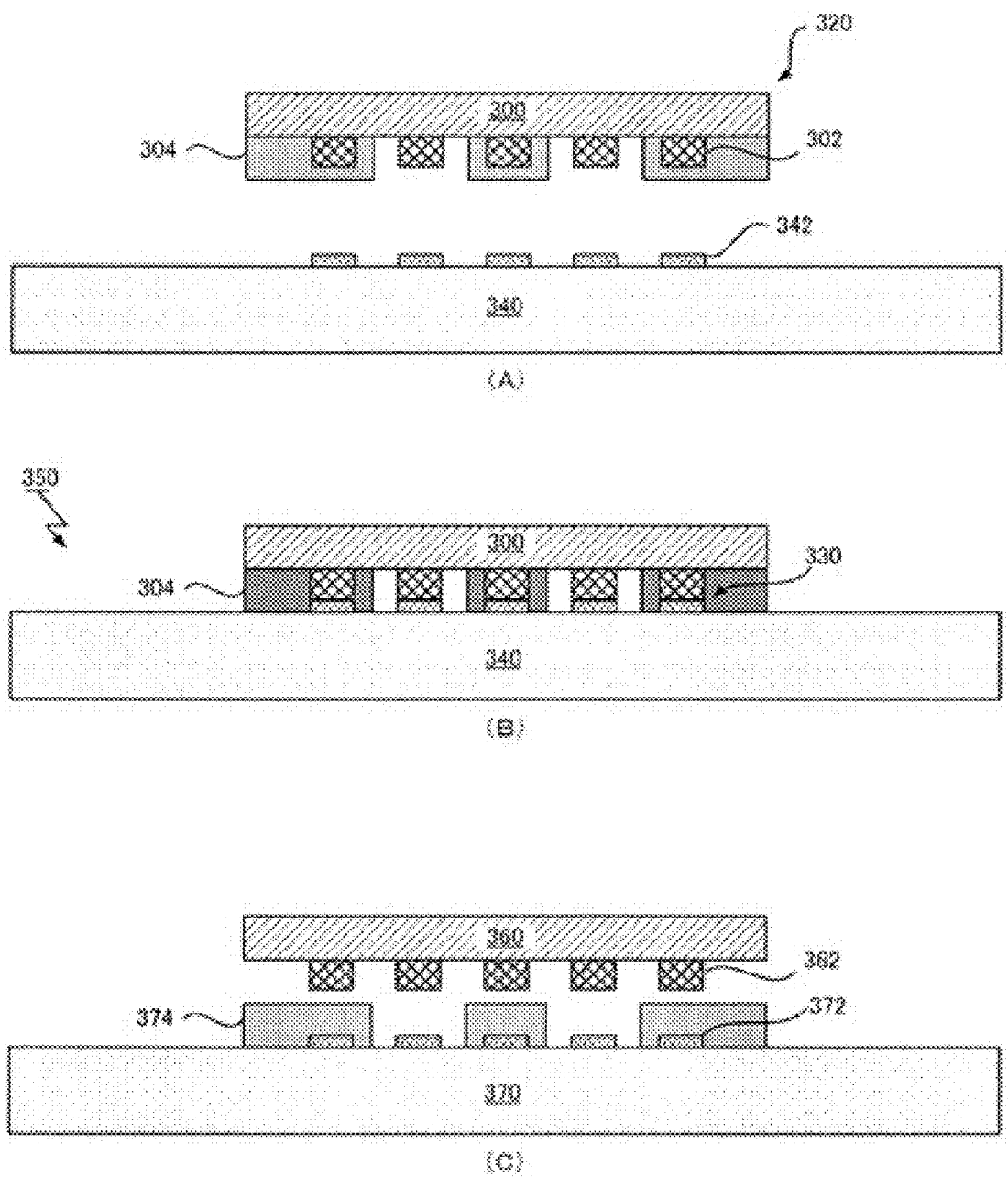
FIG. 5 is a view illustrating a joining method which uses a photosensitive resin material, according to a preferred embodiment (2/2)

A joining method with the use of a photosensitive resin material according to a preferred embodiment will be described below with reference to FIG. 4 and FIG. 5. Incidentally, the joining method illustrated in FIG. 4 and FIG. 5 is illustrated as a joining method of joining a semiconductor chip onto a substrate by a flip-chip interconnection technique, as one example. However, the joining method according to an embodiment of the present invention is not limited in particular, and can be applied to any joining method between substrates.

In the joining method illustrated in FIG. 4 and FIG. 5, in the first step, a semiconductor wafer substrate 300 is prepared on which a wire and an electrode portion 302 such as a copper pillar are formed (FIG. 4(A)). In the second step, a photosensitive resin composition is applied onto the semiconductor wafer substrate 300 so as to cover the wire and the electrode portion 302 on the semiconductor wafer substrate 300 by a known coating method such as a spin coating method, for instance, and a photosensitive resin layer 304 is formed (FIG. 4(B)). Incidentally, a film thickness of the photosensitive resin layer 304 may be designed to correspond to a pitch of bumps and material characteristics. In the third step, the coated photosensitive resin layer 304 is exposed to light with the use of a predetermined mask 310 (FIG. 4(C)). In the fourth step, the exposed photosensitive resin layer 304 is developed by a developer (FIG. 4(D)). In the fifth step, the semiconductor wafer substrate 300 having a remaining photosensitive resin layer 304 after having been developed is diced into individual pieces by dicing, and a plurality of semiconductor chips 320A and 320B are prepared which have a structure of a filling material patterned so as to avoid a predetermined signal path (FIG. 4(E)).

Incidentally, in an example illustrated in FIG. 4, the photosensitive resin layer 304 functions as a positive type photoresist, and in the third step of light exposure, the solubility of a portion 304*a* to the developer increases, which has been exposed to radiant light that has passed through an opening 310*a* of the mask 310. In the fourth step of development, the exposed portion 304*a* is dissolved to form an opening 306, and an unexposed portion is left. For information, when the photosensitive resin layer 304 functions as a negative type photoresist, in the third step of light exposure, the solubility of the exposed portion to the developer decreases. Then, in the fourth step of development, the unexposed portion is dissolved, and the exposed portion is left.

Subsequently, with reference to FIG. 5, in the sixth step of flip-chip joining, a semiconductor chip 320 is mounted on a substrate 340 so that a surface of the semiconductor chip 320 which has an electrode formed thereon faces downward and faces the substrate 340 having an electrode portion 342 such as a pad 330 formed thereon (FIG. 5(A)). In the seventh step of bonding and curing, the electrode portions 302 and 342 are melted and joined, for instance, by being heated to a predetermined temperature and pressurized, simultaneously the exposed portion 304*a* of the patterned filling material is cured, and the substrate 340 is bonded to the semiconductor chip 320 (FIG. 5(B)). Thereby, the semiconductor package 350 is formed.

Incidentally, in FIGS. 4(A) to 4(E) and FIGS. 5(A) and 5(B), it has been described that a patterning structure of the filling material is formed in a side of the semiconductor chip 320 (semiconductor wafer substrate 300). However, in the joining method according to another embodiment, a patterning structure 374 of the filling material may be formed in a side of a substrate 370, as is illustrated in FIG. 5(C). In this case, in the flip-chip joining step, a semiconductor chip 360 having no underfill structure is mounted on the substrate 370 so that the face having an electrode portion 362 formed thereon faces downward and faces the substrate 370 having an electrode portion 372 and the patterning structure 374 of the filling material formed on the surface (FIG. 5(C)). In the bonding and curing step, the joining area 130 is formed, simultaneously the patterning structure 374 is cured, and the semiconductor chip 360 is bonded to the substrate 370 (which is similar to the step in FIG. 5(B)).

As has been described above, the patterning structure of the filling material having the predetermined space therein can be simply formed with high precision, by using the photosensitive resin material and applying a photolithographic technology thereto. The photolithographic technology can form the patterning structure of the filling material with the precision of an equal level to that of the wiring pattern. Therefore, the minimum space is provided on the region of a wire, in which the space should be provided, a region as wide as possible is filled with the filling material, and thereby the lowering of the connection reliability, which originates in the provided space, can be preferably alleviated.

Incidentally, FIG. 4 and FIG. 5 are views for describing the joining method with the use of the photosensitive resin material according to a preferred embodiment, but also in an embodiment which uses a film material in place of the photosensitive resin material, the semiconductor package 350 can be formed by steps similar to those illustrated in FIG. 5. Specifically, prior to the flip-chip joining step, the semiconductor chip 320 is prepared in which the structure of the patterned filling material is formed that has the predetermined space provided therein. The structure of the patterned filling material can be formed so as to have a predetermined pattern by affixing the NCF that has been patterned into the shape in which the predetermined space is provided or by film-forming a solid coat by the NCF or the NCP, and then removing the material of the solid coat so as to have the predetermined space formed therein, by laser machining. In the flip-chip joining step, the semiconductor chip 320 is mounted on the substrate 340; and in the bonding and curing step, the semiconductor chip 320 and the substrate 340 are bonded to each other, and simultaneously the structure of the patterned filling material can be cured. The case where the substrate having the structure of the patterned filling material formed thereon is used is also similar to the above case.

Figure 6:
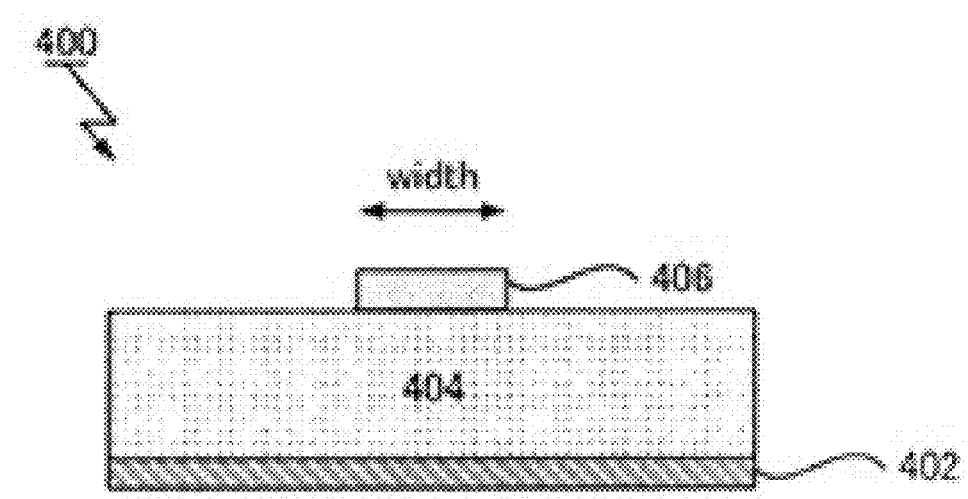
FIG. 6 is a sectional view illustrating the periphery of a signal wire of a signal transmission path structure.
Figure 7:
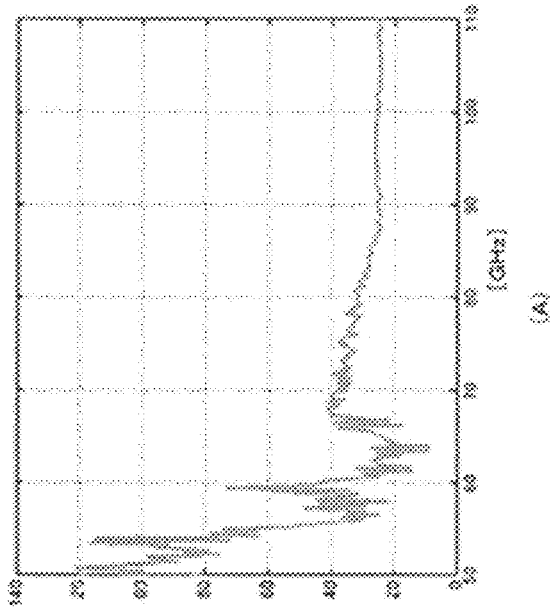
FIG. 7 is a graph illustrating a frequency response of a transmission loss of a signal wire (increase ratio of loss [%] in (A) and insertion loss [dB] per unit distance [mm] in (B)) when the signal wire is covered with an underfill and when the signal wire is not covered with the underfill.
Figure 7:
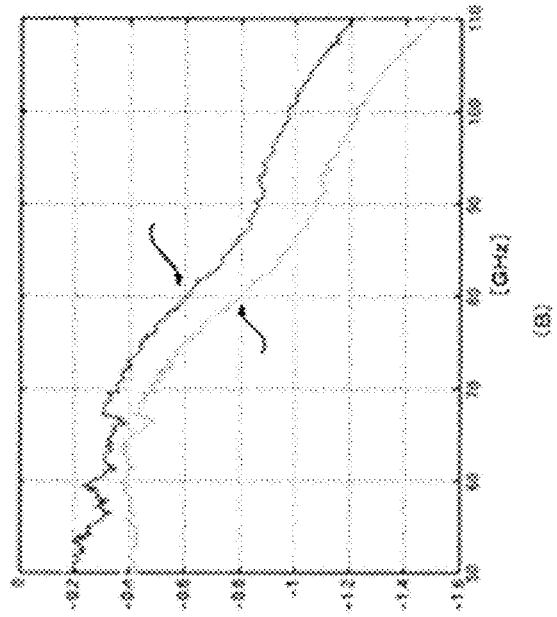

An embodiment which an effect due to the structure of the filling material is patterned so as to avoid the predetermined signal path will be described below in which the radio-frequency signal having the millimeter waveband is transmitted. FIG. 6 and FIG. 7 describe measurement results of transmission losses in a signal wire which is not covered with the filling material and in a signal wire which is covered with the filling material. FIG. 6 illustrates a cross-sectional structure of the periphery of a signal wire in a signal transmission path structure 400 concerning evaluation in an experiment. FIG. 7 is a graph illustrating a frequency response of the transmission loss of the signal wire (increase ratio of loss [%] in (A) and insertion loss [dB] per unit distance [mm] in (B)) when the signal wire is covered with the filling material and when the signal wire is not covered with the filling material.

The signal transmission path structure 400 illustrated in FIG. 6 constitutes a microstrip line, and is configured to remove an influence due to a fixture by a TRL (Through, Reflect, Line) De-embedding technique and extract the feature of the signal wire to be evaluated. The signal transmission path structure 400 illustrated in FIG. 6 is formed in the chip, and includes a ground conductor (GND) 402 of the lower face, a dielectric 404 on the ground conductor 402, and a signal wire 406 of the upper face, as is illustrated in a sectional view of FIG. 6.

In the experimental result illustrated in FIG. 7, the width of the signal wire 406 is 13 µm, and the dielectric 404 has been measured in the signal transmission path structure using silicon dioxide. The signal transmission path structure does not include the shield. A probe was connected to pads of three contact points GSG (Ground Signal Ground) which were formed in both sides of each signal wire, and the transmission loss was measured. The transmission loss in a signal wire was measured when the signal wire was not covered with the filling material and when the signal wire was covered, with the use of the same microstrip line. FIG. 7 illustrates the result. In an embodiment, a general NCP filling material having a relative permittivity of 3.5 to 4.0 was used as the underfill 140, and the thickness was set at 40 µm or more.

With reference to FIG. 7(B), an insertion loss $S_{21}$ which is one of an S parameter was −0.6 [dB/mm] at 80 GHz, in the signal wire that is not covered with the fill material. In contrast to this, it is understood that the insertion loss $S_{21}$ is degraded to −0.8 [dB/mm], in the signal wire which is covered with the fill material. In addition, with reference to FIG. 7(A), it is understood that the increase ratio of a loss (value of amount of increased loss expressed by percentage) becomes approximately 25% in a range of 70 GHz to 110 GHz, when the signal wire is covered with the filling material. Accordingly, it can be said that the transmission loss can be improved in the radio-frequency band by approximately 25%, by a structure configured so that the filling material does not cover the signal wire in which the radio-frequency signal is transmitted. In an embodiment, the empty space may be assumed to have a dielectric constant of air.

Figure 8:
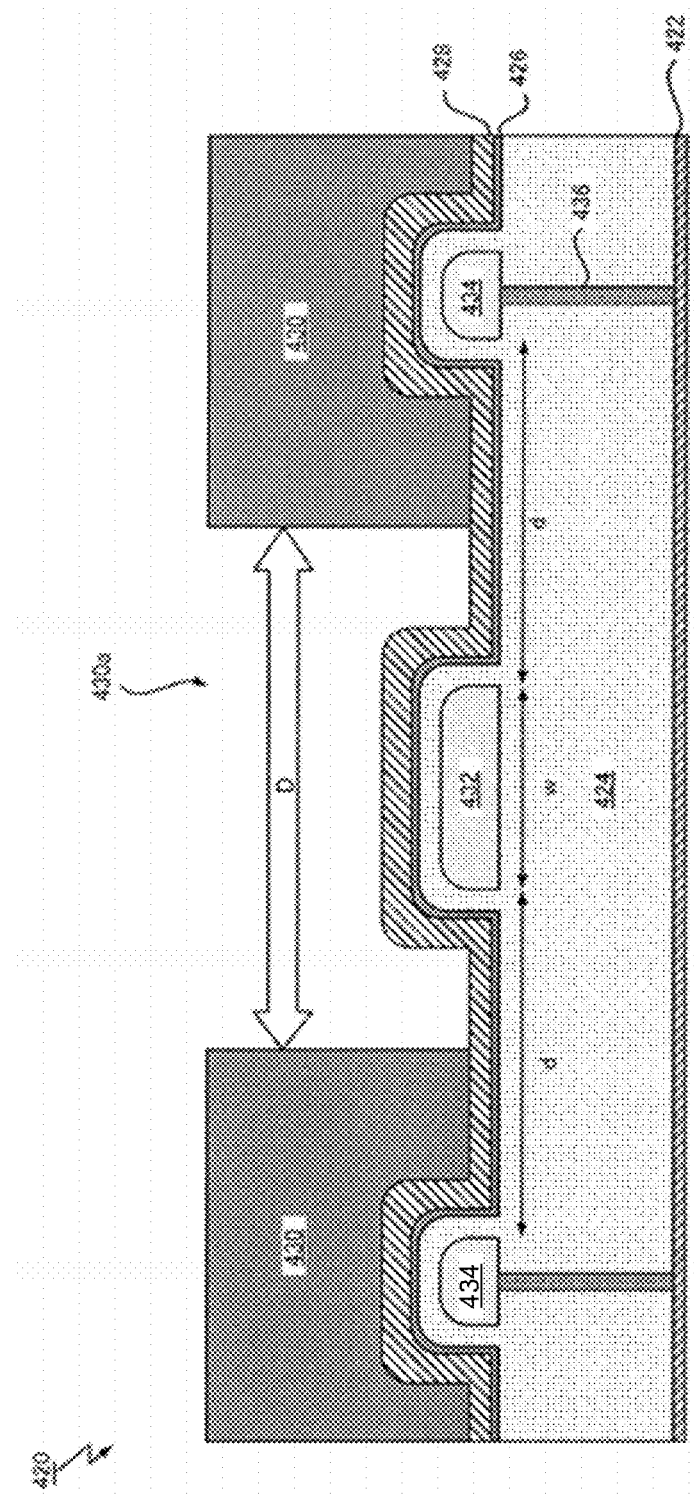
FIG. 8 is a sectional view illustrating a signal transmission path structure.
Figure 9:
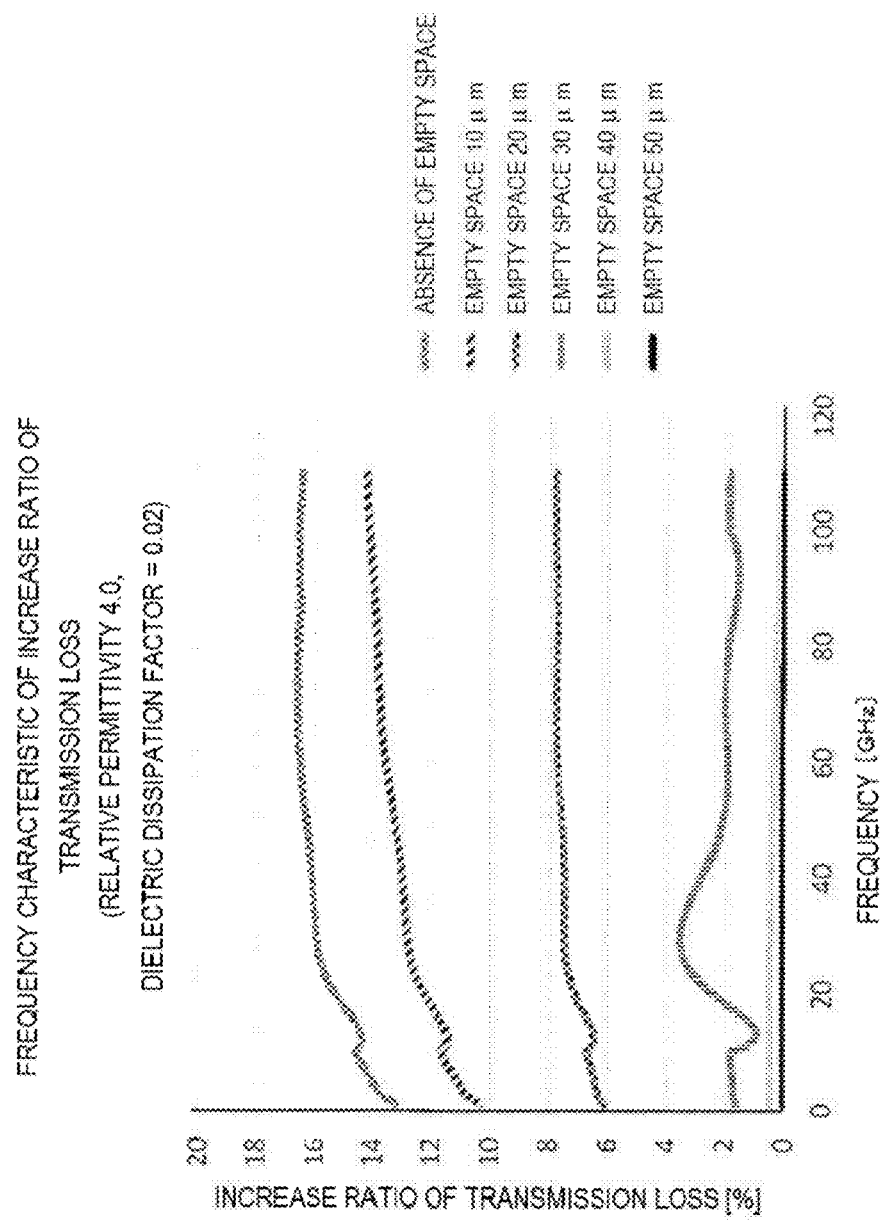
FIG. 9 is a graph illustrating a frequency response of a transmission loss when the signal wire is covered with the underfill and when an empty space having a predetermined width is provided in the underfill so as to match the signal wire.
Figure 10:
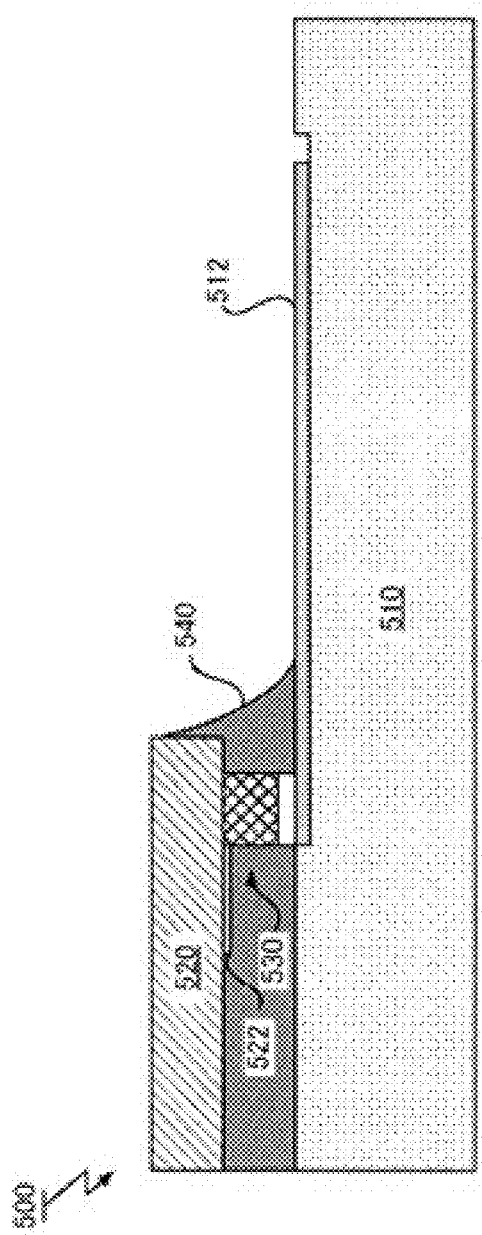
FIG. 10 is a schematic view illustrating a semiconductor package structure of a conventional technology.

The influence of the width of the empty space with respect to the wiring width will be described below. FIG. 8 and FIG. 9 are views for describing a result of having simulated the influence of the width of the empty space with respect to the wiring width. FIG. 8 is a sectional view illustrating a signal transmission path structure concerning an evaluation by the simulation. FIG. 9 is a graph illustrating frequency responses of the transmission losses in the signal wire when the signal wire is covered with the filling material and when the empty space having a predetermined width is provided in the filling material so as to match the signal wire.

The signal transmission path structure 420 illustrated in FIG. 8 includes: a ground conductor 422, a dielectric 424, a coating film 426, a protective coat 428, an underfill 430, a signal wire 432, a shield line 434, and a via 436 which connects the shield line 434 and the ground conductor 422 to each other. In an embodiment, a parameter for the dielectric 424 was set on the assumption that the dielectric was silicon dioxide or the like, for instance, a parameter for the coating film 426 was set on the assumption that the coating film 426 was a thin film of $Si_3N_4$ or the like, for instance; and a parameter for the protective coat 428 was set on the assumption that the protective coat was a coat of polyimide or the like, for instance. The line width w of the signal wire is set at 12 µm, and the shield lines 434 are provided in both sides of the signal wire so as to be distance d=20 µm apart from the signal wire. At this time, the worst electrical case out of general materials was assumed for the filling material; and the relative permittivity $\in_{UF}$ was set at 4.0 and the dielectric dissipation factor tans was set at 0.02. Under this condition, FIG. 9 illustrates a simulation result of the case where the line width D in the empty space 430a provided in the underfill 430 was set at 10 µm, 20 µm, 30 µm, 40 µm and 50 µm with respect to the line width w=12 µm.

As is illustrated in FIG. 9, it is understood that the transmission loss is improved in a wide frequency band even by an empty space provided so as to have merely a line width D (for instance, 10 µm) equivalent to the line width w of the signal wire, that the transmission loss is progressively improved as the line width increases, and that the transmission loss can be sufficiently improved when the line width is 30 µm, 40 µm and 50 µm which correspond to 2.5 times or more of the line width of the signal wire. Incidentally, a peak shown in the vicinity of 30 GHz in the case of 30 µm is a resonance which appears in the simulation, and is not significant.

As has been illustrated in FIG. 7 to FIG. 9, it may be understood that when the signal line is covered with the filling material, the transmission loss in the radio-frequency band is degraded by approximately 25%, as compared with the case where the signal wire is not covered with the filling material. It has been also shown that the transmission loss can be improved in the radio-frequency band of 50 GHz to 110 GHz by the empty space provided on a region in which the wire for the radio-frequency band is formed, by the patterning of the filling material. Furthermore, it is shown that the transmission loss can be efficiently improved by the empty space provided so as to have a width of 2.5 times or more of the wiring width. Specifically, it is acceptable to ensure the width of at least 2.5 times of the wiring width, and the lowering of the connection reliability can be minimized by decreasing an area on which the empty space is formed, and setting an area to which the filling material is bonded, as wide as possible.

As has been described above, according to an embodiment of the present invention, a joined structure can be provided which keeps a reliable connection between the substrates and can simultaneously reduce the transmission loss in the signal transmission path, in the joined structure. In addition, according to an embodiment of the present invention, a joining method and a substrate structure can be provided which keep a reliable connection between the substrates, and simultaneously reduce the transmission loss in the signal transmission path. Furthermore, according to an embodiment of the present invention, a wireless module and a wireless communication device can be provided which have reliable connection between the substrates, and simultaneously have reduced transmission loss in the signal transmission path.

The present invention has been described with reference to the particular embodiments, but the present invention is not limited to the above described embodiments, and can be changed within a scope that those skilled in the art can consider, such as other embodiments, addition, change and deletion. Any aspect should be included in the scope of the present invention as long as the aspect shows a function and an effect of the present invention.

The invention claimed is:

1. A method of joining a first substrate to a second substrate, the method comprising:
    providing the first substrate, the first substrate comprises a first plurality of conductors formed on a first surface of the first substrate;
    providing the second substrate, the second substrate comprises a second plurality of conductors formed on a second surface of the second substrate;
    providing a plurality of connecting conductors for electrically connecting each of the first plurality of conductors and each of the second plurality of conductors to each other, respectively;
    forming an underfill on the first substrate;
    electrically connecting the first plurality of conductors and the second plurality of conductors to each other with a plurality of connecting conductors, wherein the first surface and the second surface face each other; and
    bonding the first substrate and the second substrate to each other with the underfill, wherein the underfill is in direct contact with at least one of the plurality of connecting conductors and remains separated by a space from at least another one of the plurality of connecting conductors,
    wherein the first substrate comprises an antenna for transmitting and receiving electromagnetic waves of a millimeter waveband; one of the first plurality of conductors comprises a wire associated with the antenna; the second substrate is a semiconductor chip; and one of the second plurality of conductors is a wire located on the surface of the semiconductor chip associated with at least one of a low noise amplifier, a mixer, a power amplifier and a pre-driver for processing a radio-frequency signal of a millimeter waveband, wherein the antenna, the wire associated with the antenna, and the wire located on the surface of the semiconductor chip all remain separated by the space from the underfill.

2. The method according to claim 1, further comprising:
    removing a portion of the underfill to provide the space between the underfill and at least another one or more of the plurality of connecting conductors.

3. The method according to claim 1, wherein the underfill comprises a photosensitive resin, and wherein forming the underfill comprises:
    patterning the underfill by exposing the photosensitive resin to light; and
    developing the exposed photosensitive resin.

4. The method according to claim 1, wherein the space completely surrounds at least one of the one or more connecting conductors such that it does not contact at least another one of the one or more connecting conductors.

5. The method according to claim 1, wherein electrically connecting the first plurality of conductors to the second plurality of conductors and bonding the first substrate to the second substrate are performed simultaneously.

6. The method according to claim 1, wherein the underfill does not contact one or more of the first plurality of conductors, one or more of the second plurality of conductors, and one or more of the plurality of connecting conductors, each used for transmitting radio-frequency signals greater than or equal to 20 GHz.

7. The method according to claim 1, wherein the underfill is in direct contact with one or more of the first plurality of conductors, one or more of the second plurality of conductors, and one or more of the plurality of connecting conductors, each used for transmitting radio-frequency signals less than 20 GHz.

8. The method according to claim 1, wherein the first substrate is a semiconductor chip and the space in the underfill provides a signal path from the semiconductor chip to an external antenna of the second substrate.

9. The method according claim 1, wherein the underfill remains separated by a space from a wire on the surface of the first substrate, wherein the space has a width of at least 2.5 times greater than a width of the wire.

10. The method according to claim 1, wherein the space has a dielectric constant of air.

11. The method according to claim 1, wherein electrically connecting the first plurality of conductors and the second plurality of conductors comprises:
    performing a thermocompression bonding method prior to bonding the first substrate to the second substrate.

12. The method according to claim 1, wherein bonding the first substrate to the second substrate underfill comprises:
    curing the underfill material to form a mechanical connection between the first substrate and the second substrate.

13. A substrate, comprising:
a plurality of conductors on a surface of the substrate; and
an underfill on a top surface of the substrate, wherein the underfill is in direct contact with at least one of the plurality of conductors and remains separated by a space from at least another one of the plurality of conductors of the substrate,
wherein the substrate comprises an antenna for transmitting and receiving electromagnetic waves of a millimeter waveband; one of the first plurality of conductors comprises a wire associated with the antenna; a second substrate is a semiconductor chip; and one of a second plurality of conductors is a wire located on a surface of the semiconductor chip associated with at least one of a low noise amplifier, a mixer, a power amplifier and a pre-driver for processing a radio-frequency signal of a millimeter waveband, wherein the antenna, the wire associated with the antenna, and the wire located on the surface of the semiconductor chip all remain separated by the space from the underfill.

14. The substrate according to claim 13, wherein the substrate is a semiconductor chip or an organic or inorganic substrate.

15. The substrate according to claim 13, wherein the substrate is a semiconductor chip comprising an integrated radio-frequency circuit for millimeter wavebands.

16. The substrate according to claim 13, wherein the substrate comprises an antenna for sending and receiving electromagnetic waves of a millimeter waveband.

17. The substrate according to claim 13, wherein the substrate is a semiconductor chip and the space provides a signal path from the semiconductor chip to an external antenna.

18. The substrate according claim 13, wherein the underfill remains separated by the space from a wire on a surface of the substrate, wherein the space has a width of at least 2.5 times greater than a width of the wire.

* * * * *